Sept. 18, 1973 D. C. WALLS 3,759,767

MASK ALIGNMENT METHODS

Filed Oct. 8, 1971 3 Sheets-Sheet 1

INVENTOR
D.C.WALLS
BY R.Y. Peters
ATTORNEY

Sept. 18, 1973 D. C. WALLS 3,759,767

MASK ALIGNMENT METHODS

Filed Oct. 8, 1971 3 Sheets-Sheet 2

United States Patent Office 3,759,767
Patented Sept. 18, 1973

3,759,767
MASK ALIGNMENT METHODS

Donald C. Walls, Reading, Pa., assignor to Western Electric Company, Incorporated, New York, N.Y.

Filed Oct. 8, 1971, Ser. No. 187,634
Int. Cl. H01l 7/50
U.S. Cl. 156—17 9 Claims

ABSTRACT OF THE DISCLOSURE

In making semiconductive devices, it is necessary to separate groups of circuit elements formed on the face of a semiconductive wafer by etching from the backside of the wafer. To do this a layer of photoresist is applied to the backside of the wafer, a separation mask is positioned on the photoresist layer and intersecting grid lines of the mask are aligned with the wafer material lying between the groups of circuit elements. The alignment is accomplished by forming a plurality of holes, preferably with a laser, partially through the wafer at alignment references on the face of the wafer. Then, a portion of the backside of the wafer is removed to join the holes to the backside. Next, the photoresist layer is formed on the backside of the wafer so that the holes remain distinguishable and the mask is positioned on the photoresist layer and aligned with the holes. The invention is particularly useful in fabricating integrated circuits having a magnetic layer formed on the inactive sides thereof.

BACKGROUND OF THE INVENTION

Field of the invention

This invention relates to alignment methods, and more particularly to methods of making semiconductive devices having magnetic material associated therewith.

Description of the prior art

While this invention is adapted to be used in conjunction with aligning small objects, it is particularly suited for, and will be described with respect to, making semiconductive devices. Examples of such devices are diodes, transistors and integrated circuits, and they may include beam leads, as disclosed in M. P. Lepselter Pat. 3,335,338.

A beam-lead integrated circuit, to which the invention is especially applicable, includes a semiconductive body with interconnected circuit elements (such as diodes, transistors and resistors or any combination thereof) inseparably associated on or within such body. Leads are formed on the body as an integral part of the device and extend from the body as cantilever beams to form both electrical and mechanical connections to a header or to a circuit pattern formed on a substrate.

The integrated circuit is fabricated in multiple arrays from thin wafers of single crystal semiconductive material. It is believed that the techniques generally employed are well known. In general, the processing begins with the fabrication of a thin polished wafer of single crystal material formed by slicing across a single crystal ingot which may have a diameter of one inch or more. The wafer is then subjected to a succession of photoresist masking, impurity diffusion and metal deposition operations. These operations result in the formation of an array of integrated circuits on the wafer with beam leads extending from their semiconductor bodies.

At this stage of the fabrication of the integrated circuits, the wafer is mounted with wax with its active or circuit-element side facing down on a sapphire or other translucent carrier disc. The next step is the separating of the individual circuits from the wafer. In separating the integrated circuits from the wafer in accordance with the prior art techniques, the backside of the wafer is first coated with a photoresist. Next, a separation mask in the form of a grid pattern is positioned on top of the photoresist coating and infrared light is directed (1) through the carrier disc to which the wafer is mounted, (2) through the mounted wafer, (3) through the mask, and (4) into an infrared detector of an alignment microscope. The wafer transmits enough infrared light to cause the metal interconnections and beam leads of the integrated circuits to appear as shadows when viewed with the microscope. These shadows serve as a reference for aligning the grid pattern of the mask with the wafer material lying between the individual circuits. The photoresist coating is then exposed through the mask, and the coating is developed to define the pattern of the mask. Using conventional etching techniques, the individual integrated circuits are separated. (See The Western Electric Engineer, December 1967, and page 14 in particular.)

To facilitate the handling of the separated integrated circuits during further fabrication steps, a magnetic material may be associated with the circuits. (See applications, Ser. No. 69,823, filed Sept. 4, 1970, by H. E. Hughes, J. A. Morton and M. H. Wachs; and Ser. No. 792,487, filed Jan. 21, 1969, by A. D. Butherus, M. C. Huffstutler and J. A. Morton; both of which are assigned to the Bell Telephone Laboratories, Inc.) Often, this magnetic material is plated on the backside of the integrated circuits. (See the aforementioned application Ser. No. 69,823.) Since this magnetic material blocks the infrared light, the aforementioned alignment technique can no longer be used.

Accordingly, one technique of the prior art has been to mask out regions of the backside of the wafer using vinyl dots. This prevented the plating of the opaque magnetic material in these areas, thereby permitting the infrared to pass through these regions for mask alignment. Magnetic carriers used for this technique were required to have holes corresponding to these regions so that infrared could pass through such carriers. Another technique of the prior art has been the etching of relatively large holes completely through the wafer from the backside to permit visual observation of the metallization patterns on the face of the wafer. However, a number of circuits have been eliminated or damaged by these techniques, reducing yields of acceptable circuits. These techniques also required additional processing steps, slowing the fabrication of the integrated circuits and increasing their per unit manufacturing cost. In addition, accuracy of mask to wafer alignment was difficult to achieve with the infrared alignment technique because of loss of contrast between the mask and the pattern on the face of the wafer.

SUMMARY OF THE INVENTION

It is, therefore, an object of this invention to provide a method of making a semiconductive device having magnetic material associated therewith to facilitate handling.

With these and other objects in view, the present invention contemplates a new alignment method which includes forming a plurality of holes partially through a substrate having at least a first and a second side. The holes are formed at alignment references on the first side. Next, a portion of the second side of the substrate is removed to join the holes to the second side. Then, a member is aligned with the holes joined to the second side.

This invention also contemplates a method of making semiconductive devices. The method includes the steps of forming an array of circuit elements spaced one from the other on the face of a semiconductive wafer, and then forming a plurality of holes partially through the wafer at that portion of the wafer lying between the circuit elements. Next, a portion of the backside of the wafer opposite its face is removed to join the holes to such backside and a photoresist is applied to the backside so that the holes remain distinguishable. A mask is then aligned with the holes joined to the backside and the mask and underlying photoresist is exposed. Next, the photoresist is developed and washed leaving a portion of the photoresist on the backside protecting the circuit elements. Finally, the backside of the wafer is etched while the photoresist protects the circuit elements. This results in the removal of that portion of the wafer lying between the circuit elements and separates the semiconductive devices.

BRIEF DESCRIPTION OF THE DRAWINGS

Other objects and advantages of the present invention may be more clearly understood by reference to the following detailed description and accompanying drawings, wherein.

DETAILED DESCRIPTION

Figure 1:
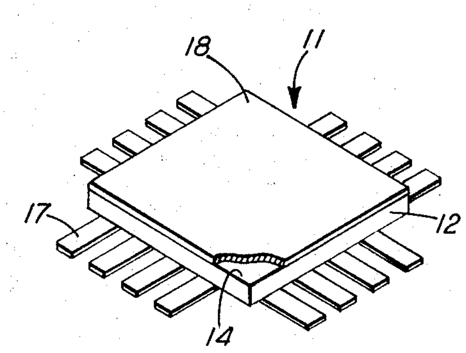
FIG. 1 is a greatly enlarged perspective view of a beam-lead integrated circuit having a magnetic material on the inactive side thereof, which has been fabricated in accordance with the present invention.

Referring now to the drawings, and in particular to FIG. 1, there is shown a semiconductive device which may be, by way of example, a beam-lead integrated circuit, designated generally by the numeral 11. The circuit 11, which is fabricated by the methods of the present invention, includes a semiconductive body 12 having an active side 13 (FIG. 3) and an inactive side 14. The active side 13 includes one or more extremely minute diffused zones within a boundary 15 that form circuit elements. These circuit elements are interconnected by metal members 16 and may include diodes, transistors, resistors or any combination thereof.

For making external connections to the circuit elements formed within the diffusion boundary 15, a plurality of beam leads 17 are provided which extend from these circuit elements beyond the edges of the ultimately formed body 12. To facilitate the handling of the integrated circuit 11 with magnetic fields, a magnetic layer 18 (FIG. 1) is formed on the inactive side 14 by plating, evaporating, sputtering or other metal deposition techniques.

Typically, the integrated circuit 11 is very minute, the semiconductive body 12 having a square shape, about 15 to 90 mils wide and about 2 mils thick, while the leads 17 are about 9 mils long and 3 mils wide. Usually, the body 12 is composed of silicon and the leads 17 are formed of gold.

Figure 2:
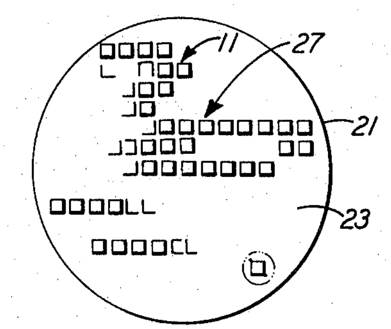
FIG. 2 is a plan view of a semiconductive wafer showing the face of the wafer on which an array of beam-lead integrated circuits are formed.

In fabricating the beam-lead integrated circuit 11 of FIG. 1, a wafer 21 (FIGS. 2–6) having a face 23 and a backside 25 is first formed by slicing across a single crystal ingot, typically silicon. Using well known techniques, the wafer 21 is subjected to a succession of photoresist masking, impurity diffusion and metal deposition operations. (See the aforementioned The Western Electric Engineer, especially pages 2–15.) These operations result in the formation of the individual integrated circuit 11, as shown in FIGS. 3–7, and the formation of a multiple array, designated generally by the numeral 27, of such circuits 11 on the face 23 of the wafer 21, as shown in FIG. 2. The circuits 11 are held together on the wafer 21 which serves as a common substrate for all such circuits 11.

Figure 4:
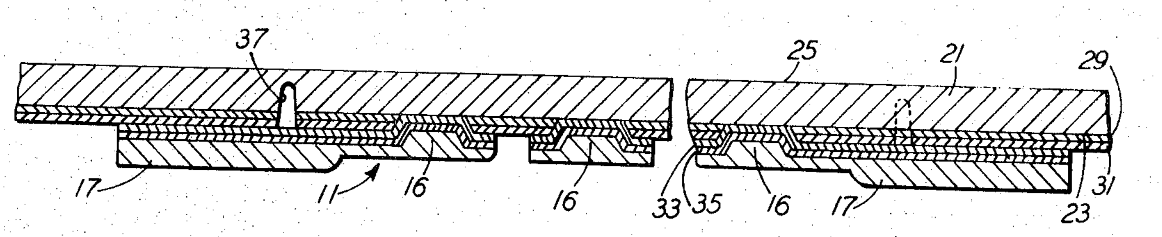
FIGS. 4–7, inclusive, are greatly enlarged sectional views of a portion of one or several beam-lead integrated circuits at various stages of their manufacture, and shows in summary form the various processing sequences for making such circuits with magnetic layers on their inactive sides.

Shown in FIG. 4 is a sectional view of a portion of the wafer 21 with a portion of one of the integrated circuits 11 of the array 27 formed on such wafer 21. Such circuit 11 includes a thin layer 29 of silicon dioxide and an overlying coating 31 of silicon nitride, both dielectrics, for passivation purposes. These layers 29 and 31 are formed on the face 23 of the wafer 21. Although the layer 29 provides protection to the diffused junctions of the circuit elements formed thereunder, the coating 31 provides additional protection by serving to permanently block the penetration of alkali metals that would impair or destroy the electrical properties of the circuit 11.

Figure 3:
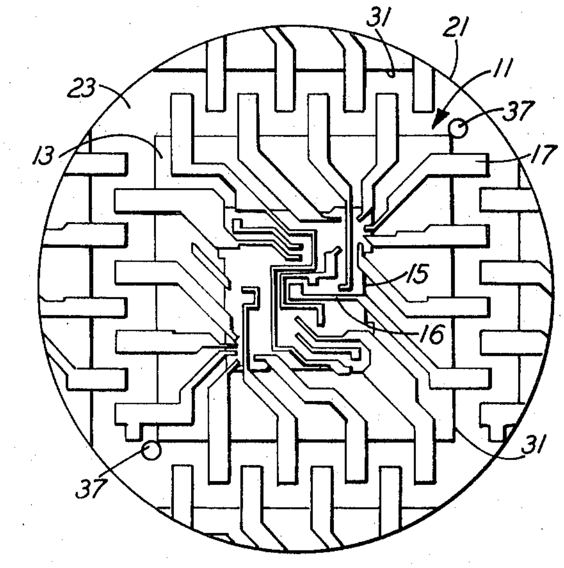
FIG. 3 is a greatly enlarged more detailed plan view of a single beam-lead integrated circuit of the array of FIG. 2.

The protective coating 31 usually has a generally rectilinear configuration, and defines the boundaries of the integrated circuit 11, as shown in FIG. 3. Selectively deposited over the coating 31 is a layer 33 of titanium and a layer 35 of platinum followed by the gold beam leads 17, as shown in FIG. 4.

After the formation of the array 27 of integrated circuits 11, a plurality of holes 37 are formed partially through the wafer 21 at opposite corners of at least one of the coatings 31 of one of the circuits 11, as shown in FIGS. 3 and 4. In the alternative, the holes 37 may be formed at opposite corners of adjacent circuits 11. Also, the holes 37 may be formed at other locations in the wafer material lying between the circuits 11 or in test circuits 11 that are later discarded. In addition, the holes 37 may be formed in the coating 31 instead of the wafer material lying between the circuits 11. In order to rapidly and accurately align, in subsequent processing steps, a separation mask 39 (FIGS. 6 and 9) with the wafer material lying between the protective coatings 31, preferably eight of such holes 37 are formed at opposite corners of the coatings 31, four of such holes 37 being located as a group at opposite sides of a diameter of the wafer 21.

It is very important that the holes 37 be very small so that they will not damage any of the adjacent integrated circuits 11 of the array 27. Typically, the integrated circuits 11 are formed on the face 23 of the wafer 21 so that the coatings 31 that define the circuits 11 are spaced apart about 5 mils and the holes 37 do not exceed about 2 mils in diameter. It is also important that in forming the holes 37 that wafer material does not build up or a hump is not formed in the vicinity of the holes 37. For these reasons, the holes 37 are not formed completely through the wafer 21 although its thickness is only in the order of about 12 mils.

Figure 9:
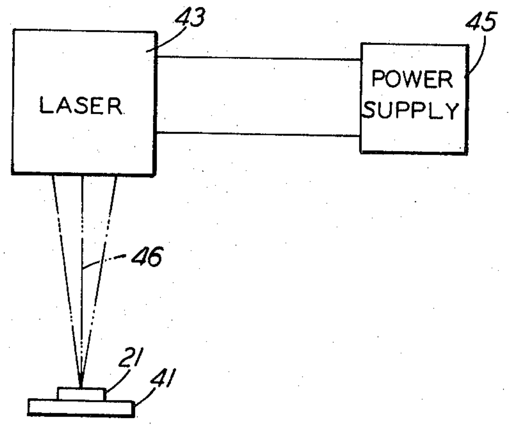
FIG. 9 is a schematic representation of an apparatus including a laser for forming holes in the wafer in accordance with the invention.

To form the holes 37 in the wafer 21 without damaging the integrated circuits 11 and without wafer material build up, apparatus of the type shown schematically in FIG. 9 is advantageously employed. The apparatus includes a suitable holder 41 for the wafer 21, a conventional laser 43 and a conventional power supply 45. The energy level and duration of the light, illustrated by the rays 46, emitted by the laser 43 are controlled by controlling the energy level and duration of an electrical pulse transmitted from the power supply 45 to a flash lamp (not shown) of the laser 43. By forming the holes 37 with the laser 43, the holes 37 acquire the general configuration of a cone with a rounded-off apex, as shown in FIGS. 4 and 5.

Typically, the laser 43 includes a neodymium-YAG (Yttrium-Aluminum-Garnet) lasing crystal, with a wavelength of 1.06 microns. The output energy required is in the order of 25 mj. at 10 pulses per second. A laser system meeting these requirements is that sold by the Raytheon Company as Model SS–117.

Figure 5:
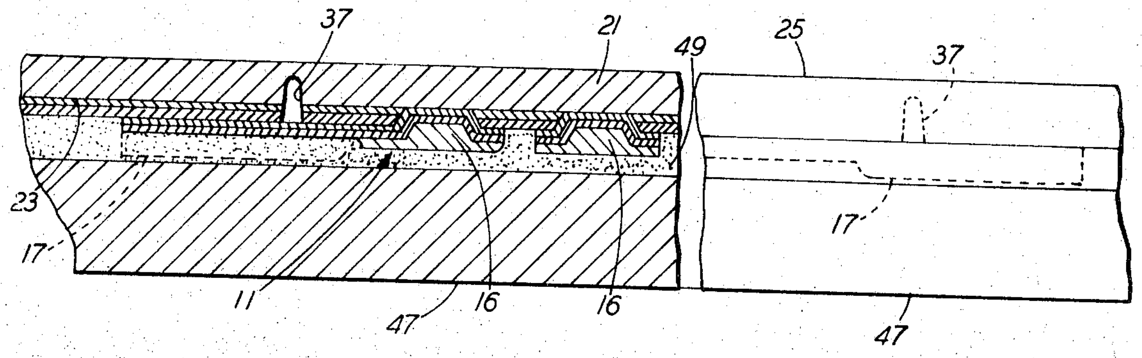

After the forming of the holes 37, the wafer 21 shown in FIG. 4 is mounted to a process carrier 47, as shown in FIG. 5, with the face 23 adjacent the carrier 47. The wafer 21 is advantageously mounted by first melting a quantity of wax, placing the wafer 21 in the melted wax, and solidifying the wax to form a layer 49 to hold the wafer 21 to the carrier 47. Next, a portion of the backside 25 of the wafer 21 is removed to join the holes 37 to such backside 25. This removal also permits subsequent separation etching to required dimensions without excessive lateral etching and circuit damage. Preferably, this removal is accomplished by lapping. After the removal operation, each hole 37 acquires a generally frustoconical configuration with a wedge-shaped edge defining each hole 37, as shown in FIG. 6.

Figure 6:
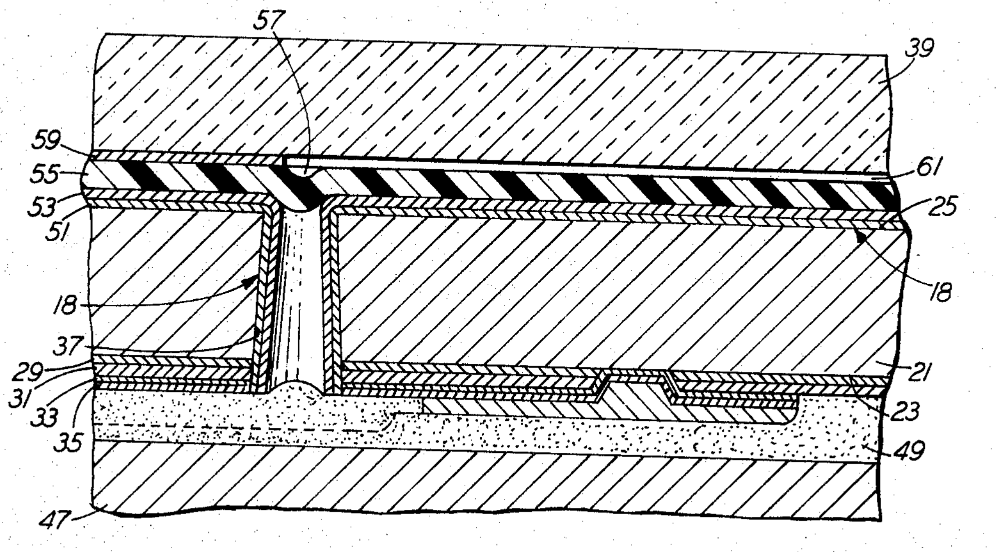

After the removal step, the magnetic layer 18 is formed on the backside 25 of the wafer 21 and on the inner surfaces of the holes 37 of the wafer 21, as shown in FIG. 6. This may be advantageously accomplished by electrolessly plating a layer 51 (FIG. 6) of nickel on such backside 25 and surfaces of the holes 37 followed by electroplating a layer 53 of permalloy on the nickel layer 51. These plating processes are well known in the prior art, and typically result in the nickel 51 having a thickness of about 2000 A. and the permalloy layer 53 having a thickness of about 0.2 to 0.3 mil.

It is to be understood that this plating process is only one of several ways by which the magnetic material may be formed on the backside 25 of the wafer 21 and that other techniques such as sputtering, evaporation or the like may also be used.

Next, a layer 55 of a photoresist is formed on the permalloy layer 53 by applying the photoresist in a fluid state to the layer 53 and spinning the wafer 21 at high speeds. Typically, the photoresist is negative acting and may be that sold by the Eastman Kodak Company under the trade designation "KMER" or that sold by Hunt Chemical Company under the designation "Waycoat." Due to the holes 37 in the wafer 21, depressions 57 are formed in the layer 55 by applying the photoresist over such holes 37. As a result, the location of the holes 37 remain distinguishable after the application of the photoresist. However, because of their microscopic size, it should be appreciated that a microscope (not shown) is required to view the holes 37.

Figure 8:
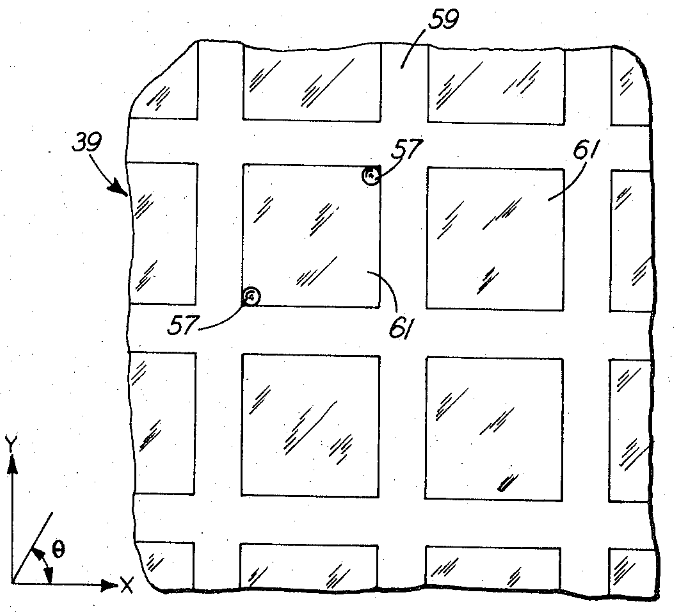
FIG. 8, in showing a portion of the processing sequences, also shows a plan view of a mask of FIG. 6 and illustrates the alignment of the mask with depressions formed in a photoresist layer on the backside of the wafer.

Following the formation of the photoresist layer 55, the separation mask 39 is positioned on the photoresist layer 55, as shown in FIGS. 6 and 8. The mask 39 has the configuration of a grid with opaque intersecting lines 59 enclosing transparent squares 61 (FIG. 8). The lines 59 correspond to the material lying between the protective coatings 31 that must be removed to separate the circuits 11 from the wafer 21 and the squares 61 correspond to the coatings 31 that define the boundaries of the circuits 11 which must be protected in a subsequent etching step.

Next, the mask 39 is aligned to the depressions 57 formed by the holes 37 so that at least two depressions 57 are located at the opposite corners of one of the squares 61, as shown in FIG. 8.

As previously mentioned, eight such holes 37 and therefore eight depressions 57 are preferably used in so aligning the mask 39. These holes 37 are located at opposite corners of the coating 31, four of such holes 37 being located as a group at opposite ends of a diameter of the wafer 21. This alignment with the eight holes assures the proper alignment in the X and Y directions and in the $\theta$ angle, as shown in FIG. 8. This proper X, Y and $\theta$ alignment assures proper alignment of: (1) the perimeter of the mask 39 with the perimeter of the wafer 21, the opaque lines 59 with the wafer material between the coatings 31, and the squares 61 with the coatings 31. This alignment is normally accomplished by an operator using a microscope (not shown) to view the mask 39 and the depressions 57 overlying the holes 37 of the wafer 21 at the same time.

After the alignment, the photoresist layer 55 is exposed to ultraviolet light through the mask 39 to polymerize that portion of the layer 55 underlying the transparent squares 61.

The mask 39 is then removed and the photoresist layer 55 on the wafer 21 is developed and washed. This results in the removal of the area of the photoresist layer 55 that was under the opaque lines 59 of the mask 39 (not exposed to the ultraviolet light).

Next, the wafer 21 is subjected to an etching operation, wherein that portion of the wafer 21 is not protected by the photoresist layer 55, that is, the wafer material lying between the coatings 31 is removed. Typically, the etchant used is a mixture of about 5 parts nitric acid, 3 parts acetic acid and 1 part hydrofluoric acid, followed by another etchant of buffered hydrofluoric acid. By removing the wafer material between the coatings 31, this etching operation physically separates the individual circuits 11 from each other but leaves them firmly held as an array by the wax layer 49 to the process carrier 47.

Figure 7:
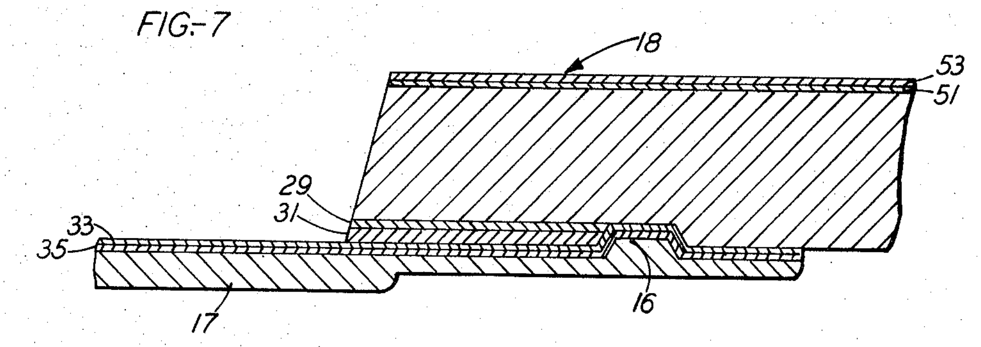

Following the etching operation, the remaining photoresist layer 55 that had protected the coating 31 and its underlying elements is removed. Thus, the fabrication of the circuits 11, as shown in FIGS. 1 and 7, is now complete and the circuits 11 are tested in accordance with prior art techniques.

The fabricated integrated circuits 11 may be stored and transported while held to the process carrier 47 by the wax coating 49. In the alternative, the wax coating 49 may be melted and/or removed with solvents, such as ozone or the like, and the circuits 11 may be transferred from the process carrier 47. Since the circuits 11 have the magnetic layer 18 formed on the inactive sides 13 thereof, this transfer may be accomplished with magnetic facilities such as a permanent magnet, an electromagnet or the like.

In the specific disclosure of this invention, particular materials, structures and methods have been disclosed. However, the invention is not restricted to these particular materials, structures or methods. For example, dielectric layers of silicon dioxide and silicon nitride have been referred to, but additionally, layers of aluminum oxide, various silicates and the like may also be used. Likewise, the incorporation of the magnetic material is not restricted to silicon, but may be applied to a variety of useful semiconductive materials.

Accordingly, although the invention has been disclosed in terms of particular arrangements, structures and methods, it is to be understood that numerous other arrangements may be readily devised by those skilled in the art which likewise fall within the spirit and scope of the invention.

In particular, although the disclosure is directed primarily to semiconductive devices, it is to be understood that the invention may also be used in connection with other articles.

What is claimed is:

1. An alignment method comprising:

forming a plurality of conically-shaped holes partially through a semiconductive substrate capable of bearing circuit elements and having at least a first and a second side, each hole being formed at an alignment reference on the first side and the base of each conically-shaped hole being on the first side;

removing a portion of the second side of the substrate to join each hole to the second side of the substrate and to form a wedge-shaped edge defining each hole in the remaining second side;

forming a layer of photosensitive material on the second side, the layer spanning each hole and its wedge-shaped edge and producing a distinct depression over each hole; and aligning a patterned mask with the depressions and hence the holes.

2. The method of claim 1, wherein the holes are formed by applying an energy pulse to the first side of the substrate at the references.

3. The method of claim 2, wherein the energy pulse for the formation of the holes is a pulse of monochromatic coherent light generated by a laser.

4. An alignment method, comprising:

forming a plurality of holes partially through a semiconductive substrate capable of bearing circuit elements and having at least a first and a second side, each hole being formed at an alignment reference on the first side and each hole having the configuration of a cone with a rounded-off apex;

removing a portion of the second side of the substrate to join each hole to the second side of the substrate and to change the configuration of each hole to that of a frustum of a cone, the intersection of each hole with the remaining second side forming a sharp edge with an acute angle;

forming a layer of photosensitive material on the remaining second side, with the layer spanning the holes and their sharp edges, the portion of the layer spanning each hole and each sharp edge producing a depression so that the location of each hole remains distinguishable; and aligning a patterned mash with the depressions and hence the holes.

5. A method of aligning a patterned mask with a configuration formed on a first side of a semiconductor wafer also having a second side, comprising:

forming a plurality of conically-shaped holes partially through the wafer, the holes being formed at alignment references on the first side and the bases of the conically-shaped holes being on the first side, the references being associated with the configuration;

removing a portion of the second side of the wafer to join the holes to the second side of the wafer and to from wedge-shaped edges defining the holes in the remaining second side;

forming a photosensitive layer on the second side of the wafer, the layer spanning the wedge-shaped edges of the holes such that the holes remain distinguishable;

positioning the mask on the layer on the second side; and aligning the mask with the distinguishable holes joined to the second side to thereby align the mask with the configuration on the first side.

6. The method of claim 5, wherein the configuration is an array of integrated-circuit elements and the alignment references are at least two corners of a protective coating overlying the elements.

7. The method of claim 5, wherein the holes remain distinguishable due to depressions formed in the layer by forming the layer over the holes, and the mask is aligned with such depressions.

8. A method of making semiconductive devices, comprising:

forming an array of circuit elements spaced one from the other on the face of a semiconductive wafer;

forming a plurality of conically-shaped holes partially through the wafer at the portion of the wafer lying between the circuit elements, the bases of the conically-shaped holes being on the side of the wafer having the circuit elements;

removing a portion of the backside of the wafer opposite its face to join the holes to such backside and to form wedge-shaped edges defining the holes in the remaining second side;

depositing a layer of photoresist on the backside of the wafer, the layer spanning the wedge-shaped edges of the holes and forming depressions at the locations of the holes such that the locations of the holes remain distinguishable;

aligning a patterned mask with the depressions and hence holes joined to the backside;

exposing the mask and underlying photoresist, and developing and washing the photoresist to leave a portion of the photoresist protecting the circuit elements from the backside of the wafer; and etching the backside of the wafe while the photoresist protects the circuit elements to remove the portion of the wafer lying between the circuit elements, and thereby separate the semiconductive devices.

9. A method of making integrated circuits, comprising:

forming an array of individual groups of circuit elements on the face of a semiconductive wafer, each group having a protective coating with a rectilinear configuration thereon and each group having a space between it and the other groups;

forming with a laser at least two holes partially through the wafer without any build-up of material of the wafer in the vicinity of the holes, the holes being at the opposite corners of the coating of at least one group of circuit elements, each of the holes having the configurations of a core with a rounded-off apex;

mounting the face of the wafer to a carrier;

removing from the backside of the wafer opposite its face a portion of such backside to join the holes to said backside and to change the configuration of each of the holes to a frustum of a cone;

forming a layer of magnetic material on the backside of the wafer and the surfaces of the holes such that the holes remain distinguishable;

depositing a layer of photoresist on the layer of magnetic material and over such holes to form depressions at the locations of the holes so that the holes remain distinguishable;

positioning on the photoresist layer a mask having the configuration of a grid with intersecting opaque lines enclosing transparent squares, the lines corresponding to the space between the groups of circuit elements and the squares corresponding to the protective coatings;

aligning the mask to the holes such that at least two of the holes are located at the opposite corners of the squares of the mask;

exposing the photoresist layer through the mask to a light source;

removing the mask from the photoresist layer;

developing the photoresist layer to form a pattern therein corresponding to the mask;

etching the backside of the wafer while the photoresist layer protects the circuit elements of the groups to remove that portion of the wafer corresponding to the opaque lines of the mask to separate the groups from each other and thereby form the integrated circuits;

removing the remaining photoresist layer from the integrated circuits; and transferring the circuits from the carrier with a magnetic means.

References Cited

Magnetic Handling of Beam Head Integrated Circuits, by Hughes et al., IEEE Trans, May 1971, pp. 417–25, especially p. 418, par. 5.

JACOB H. STEINBERG, Primary Examiner

U.S. Cl. X.R.

156—345; 355—40